United States Patent
Mow et al.

(10) Patent No.: US 9,070,968 B2
(45) Date of Patent: Jun. 30, 2015

(54) METHODS FOR CHARACTERIZING TUNABLE RADIO-FREQUENCY ELEMENTS IN WIRELESS ELECTRONIC DEVICES

(75) Inventors: Matthew A. Mow, Los Altos, CA (US); Rocco V. Dragone, Jr., Mountain View, CA (US); Thomas E. Biedka, San Jose, CA (US); Robert W. Schlub, Cupertino, CA (US); Ruben Caballero, San Jose, CA (US)

(73) Assignee: Apple Inc., Cupertino, CA (US)

( * ) Notice: Subject to any disclaimer, the term of this patent is extended or adjusted under 35 U.S.C. 154(b) by 619 days.

(21) Appl. No.: 13/437,804

(22) Filed: Apr. 2, 2012

(65) Prior Publication Data

US 2013/0257454 A1    Oct. 3, 2013

(51) Int. Cl.
| | |
|---|---|
| *H01Q 9/04* | (2006.01) |
| *H01Q 5/328* | (2015.01) |
| *G01R 29/10* | (2006.01) |
| *H04B 17/10* | (2015.01) |

(52) U.S. Cl.
CPC ............ *H01Q 9/0421* (2013.01); *G01R 29/10* (2013.01); *H01Q 5/328* (2015.01); *H04B 17/103* (2015.01)

(58) Field of Classification Search
USPC ...................................... 455/67.11
See application file for complete search history.

(56) References Cited

U.S. PATENT DOCUMENTS

| | | | |
|---|---|---|---|
| 6,208,841 B1 | 3/2001 | Wallace et al. | |
| 6,525,657 B1 * | 2/2003 | Wojcik | 340/514 |
| 7,035,594 B2 | 4/2006 | Wallace et al. | |
| 7,516,678 B2 | 4/2009 | Moller et al. | |
| 2003/0151556 A1 * | 8/2003 | Cohen | 343/700 MS |
| 2008/0056340 A1 | 3/2008 | Foegelle | |
| 2013/0295856 A1 * | 11/2013 | Talwar et al. | 455/67.12 |

OTHER PUBLICATIONS

Matthew A Mow, U.S. Appl. No. 13/415,195, filed Mar. 8, 2012.
Joshua G. Nickel, U.S. Appl. No. 13/092,808, filed Apr. 22, 2011.
Joshua G. Nickel, U.S. Appl. No. 13/097,847, filed Apr. 29, 2011.
Joshua G. Nickel, U.S. Appl. No. 13/111,926, filed May 19, 2011.
Joshua G. Nickel, U.S. Appl. No. 13/183,393, filed Jul. 14, 2011.

* cited by examiner

*Primary Examiner* — Ajibola Akinyemi
(74) *Attorney, Agent, or Firm* — Treyz Law Group; Jason Tsai; Joseph F. Guihan

(57) ABSTRACT

A wireless electronic device may contain an antenna tuning element for tuning the device's operating frequency range. The antenna tuning element may include radio-frequency switches, continuously/semi-continuously adjustable components such as tunable resistors, inductors, and capacitors, etc. A test system may be used to measure the radio-frequency characteristics associated with the tuning element assembled with an electronic device. The test system may include a test host, a test chamber, a signal generator, power meters, and radio-frequency testers. The electronic device under test (DUT) may be placed in the test chamber. The signal generator may generate radio-frequency test signals for energizing the antenna tuning element. The power meters and radio-frequency testers may be used to measure conducted and radiated signals emitted from the DUT while the DUT is placed in different desired orientations. A phantom object is optionally placed in the vicinity of the DUT to simulate actual user scenario.

19 Claims, 9 Drawing Sheets

METHODS FOR CHARACTERIZING TUNABLE RADIO-FREQUENCY ELEMENTS IN WIRELESS ELECTRONIC DEVICES

BACKGROUND

This relates generally to wireless communications circuitry, and more particularly, to electronic devices that have wireless communications circuitry.

Electronic devices such as portable computers and cellular telephones are often provided with wireless communications capabilities. For example, electronic devices may use long-range wireless communications circuitry such as cellular telephone circuitry to communicate using cellular telephone bands. Electronic devices may use short-range wireless communications circuitry such as wireless local area network communications circuitry to handle communications with nearby equipment. Electronic devices may also be provided with satellite navigation system receivers and other wireless circuitry.

To satisfy consumer demand for small form factor wireless devices, manufacturers are continually striving to implement wireless communications circuitry such as antenna components using compact structures. However, it can be difficult to fit conventional antenna structures into small devices. For example, antennas that are confined to small volumes often exhibit narrower operating bandwidths than antennas that are implemented in larger volumes. If the bandwidth of an antenna becomes too small, the antenna will not be able to cover all communications bands of interest.

In view of these considerations, it would be desirable to provide antenna tuning elements that allow the antenna to cover a wider range of frequency bands. Moreover, it may be desirable to provide ways for characterizing the performance of such types of tuning elements when assembled within a wireless electronic device.

SUMMARY

A wireless electronic device may include storage and processing circuitry and wireless communications circuitry. The wireless communications circuitry may include a baseband processor, transceiver circuitry, and at least one antenna. The antenna may include an antenna resonating element and at least one antenna tuning element. The antenna tuning element may be used to help the antenna cover a wider range of communications frequencies than would otherwise be possible.

The tunable element may include radio-frequency switches, continuously or semi-continuously tunable resistive/inductive/capacitive components forming using integrated circuits, discrete surface mount components, or other suitable conductive structures, and other load circuits configured to provide desired impedance characteristics for the antenna at selected frequencies.

In accordance with an embodiment of the present invention, a test system may be provided that includes a test host, a test chamber, a signal generator, power meters, radio-frequency testers, and other test equipment (e.g., radio-frequency switches, power amplifiers, isolators, filters, etc.). An electronic device under test (DUT) containing an antenna tuning element may be placed in the test chamber. The test host may configure the signal generator to provide radio-frequency test signals at a selected fundamental frequency to the antenna tuning element in the DUT. A first of the power meters may be used to measure the power level at which the test signals are being delivered to the DUT. A second of the power meters may be used to measure the power kevel of signals that are reflected back from the DUT. A first of the testers (e.g., a first spectrum) may be used to measure the harmonic distortion levels (i.e., $2^{nd}$ order harmonic distortion, $3^{rd}$ order harmonic distortion, $4^{th}$ order harmonic distortion, etc.) for the signals being reflected back from the DUT.

The test host may control a positioner in the test chamber to vary the position/orientation of the DUT within the test chamber during testing. A phantom object may be placed in the vicinity of the DUT to facilitate in simulating actual user scenarios in which a user's hand or body part may impact the performance of the DUT.

In response to receiving the radio-frequency test signals from the signal generator, the antenna tuning element may radiate corresponding radio-frequency signals. A test antenna (e.g., a horn antenna) within the test chamber may be used to receive the radiated radio-frequency signals from the DUT. The radiated signals may be separated accordingly to their polarization orientation. A first portion of the radiated signals that are horizontally polarized may be fed to a second of the testers (e.g., a second spectrum analyzer), whereas a second portion of the radiated signals that are vertically polarized may be fed to a third of the testers (e.g., a third spectrum analyzer). The second and third spectrum analyzers may be used to measure the harmonic distortion levels for the radiated radio-frequency signals.

The test host may retrieve the radio-frequency measurement results obtained using the power meters and the spectrum analyzers and may compare the test results to predetermined threshold levels to determine whether the antenna tuning element and the antenna of the DUT satisfy design criteria. In the scenario in which the test results fail to satisfy design criteria, the antenna tuning element may be removed and inspected for possible manufacturing defects, the position of the antenna tuning element within the DUT may be changed to help minimize radio-frequency interference, and/or other changes can be made in an effort to obtain satisfactory test results.

Further features of the present invention, its nature and various advantages will be more apparent from the accompanying drawings and the following detailed description.

DETAILED DESCRIPTION

Figure 1:
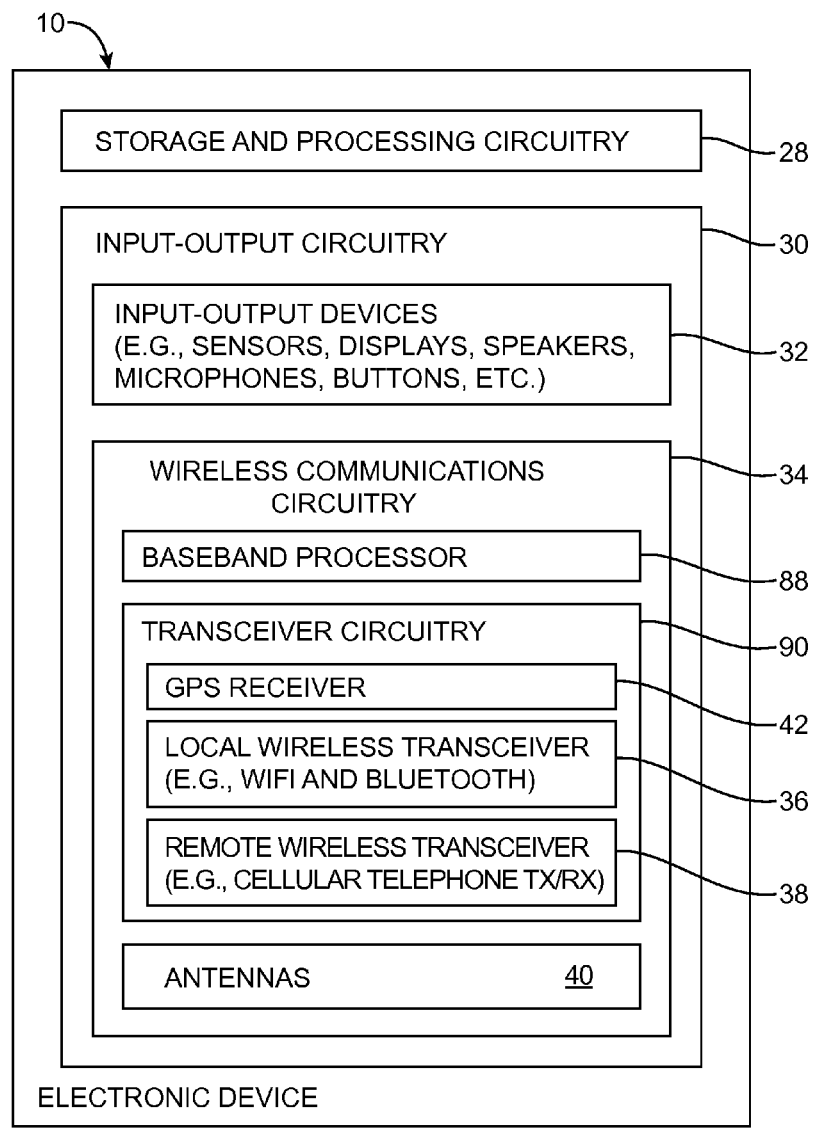
FIG. 1 is a schematic diagram of an illustrative electronic device with wireless communications circuitry in accordance with an embodiment of the present invention.

Electronic devices such as device 10 of FIG. 1 may be provided with wireless communications circuitry. The wireless communications circuitry may be used to support long-range wireless communications such as communications in cellular telephone bands. Examples of long-range (cellular telephone) bands that may be handled by device 10 include the 800 MHz band, the 850 MHz band, the 900 MHz band, the 1800 MHz band, the 1900 MHz band, the 2100 MHz band, the 700 MHz band, and other bands. The long-range bands used by device 10 may include the so-called LTE (Long Term Evolution) bands. The LTE bands are numbered (e.g., 1, 2, 3, etc.) and are sometimes referred to as E-UTRA operating bands. Long-range signals such as signals associated with satellite navigation bands may be received by the wireless communications circuitry of device 10. For example, device 10 may use wireless circuitry to receive signals in the 1575 MHz band associated with Global Positioning System (GPS) communications. Short-range wireless communications may also be supported by the wireless circuitry of device 10. For example, device 10 may include wireless circuitry for handling local area network links such as WiFi® links at 2.4 GHz and 5 GHz, Bluetooth® links at 2.4 GHz, etc.

As shown in FIG. 1, device 10 may include storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. This processing circuitry may be based on one or more microprocessors, microcontrollers, digital signal processors, application specific integrated circuits, etc.

Storage and processing circuitry 28 may be used to run software on device 10, such as internet browsing applications, voice-over-internet-protocol (VOIP) telephone call applications, email applications, media playback applications, operating system functions, functions related to communications band selection during radio-frequency transmission and reception operations, etc. To support interactions with external equipment such as base station 21, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, IEEE 802.16 (WiMax) protocols, cellular telephone protocols such as the "2G" Global System for Mobile Communications (GSM) protocol, the "2G" Code Division Multiple Access (CDMA) protocol, the "3G" Universal Mobile Telecommunications System (UMTS) protocol, and the "4G" Long Term Evolution (LTE) protocol, MIMO (multiple input multiple output) protocols, antenna diversity protocols, etc. Wireless communications operations such as communications band selection operations may be controlled using software stored and running on device 10 (i.e., stored and running on storage and processing circuitry 28 and/or input-output circuitry 30).

Input-output circuitry 30 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices may include touch screens, displays without touch sensor capabilities, buttons, joysticks, click wheels, scrolling wheels, touch pads, key pads, keyboards, microphones, cameras, buttons, speakers, status indicators, light sources, audio jacks and other audio port components, digital data port devices, light sensors, motion sensors (accelerometers), capacitance sensors, proximity sensors, etc.

Input-output circuitry 30 may include wireless communications circuitry 34 for communicating wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless communications circuitry 34 may include radio-frequency transceiver circuitry 90 for handling various radio-frequency communications bands. For example, circuitry 90 may include transceiver circuitry 36, 38, and 42. Transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in cellular telephone bands such as at 850 MHz, 900 MHz, 1800 MHz, 1900 MHz, and 2100 MHz and/or the LTE bands and other bands (as examples). Circuitry 38 may handle voice data and non-voice data traffic.

Transceiver circuitry 90 may include global positioning system (GPS) receiver equipment such as GPS receiver circuitry 42 for receiving GPS signals at 1575 MHz or for handling other satellite positioning data. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include one or more antennas 40. Antennas 40 may be formed using any suitable antenna types. For example, antennas 40 may include antennas with resonating elements that are formed from loop antenna structure, patch antenna structures, inverted-F antenna structures, slot antenna structures, planar inverted-F antenna structures, helical antenna structures, hybrids of these designs, etc. Different types of antennas may be used for different bands and combinations of bands. For example, one type of antenna may be used in forming a local wireless link antenna and another type of antenna may be used in forming a remote wireless link antenna.

As shown in FIG. 1, wireless communications circuitry 34 may also include baseband processor 88. Baseband processor may include memory and processing circuits and may also be considered to form part of storage and processing circuitry 28 of device 10.

Baseband processor 88 may be used to provide data to storage and processing circuitry 28. Data that is conveyed to circuitry 28 from baseband processor 88 may include raw and processed data associated with wireless (antenna) performance metrics for received signals such as received power, transmitted power, frame error rate, bit error rate, channel quality measurements based on received signal strength indicator (RSSI) information, channel quality measurements based on received signal code power (RSCP) information, channel quality measurements based on reference symbol received power (RSRP) information, channel quality measurements based on signal-to-interference ratio (SINR) and signal-to-noise ratio (SNR) information, channel quality measurements based on signal quality data such as Ec/Io or Ec/No data, information on whether responses (acknowledgements) are being received from a cellular telephone tower corresponding to requests from the electronic device, information on whether a network access procedure has succeeded, information on how many re-transmissions are being requested over a cellular link between the electronic device and a cellular tower, information on whether a loss of signaling message has been received, information on whether paging signals have been successfully received, and other information that is reflective of the performance of wireless circuitry 34. This information may be analyzed by storage and processing circuitry 28 and/or processor 88 and, in response, storage and processing circuitry 28 (or, if desired, baseband processor 58) may issue control commands for controlling wireless circuitry 34. For example, baseband processor 88 may issue commands that direct transceiver circuitry 90 to switch into use desired transmitters/receivers and antennas.

Antenna diversity schemes may be implemented in which multiple redundant antennas are used in handling communications for a particular band or bands of interest. In an antenna diversity scheme, storage and processing circuitry 28 may select which antenna to use in real time based on signal strength measurements or other data. In multiple-input-multiple-output (MIMO) schemes, multiple antennas may be used in transmitting and receiving multiple data streams, thereby enhancing data throughput.

Figure 2:
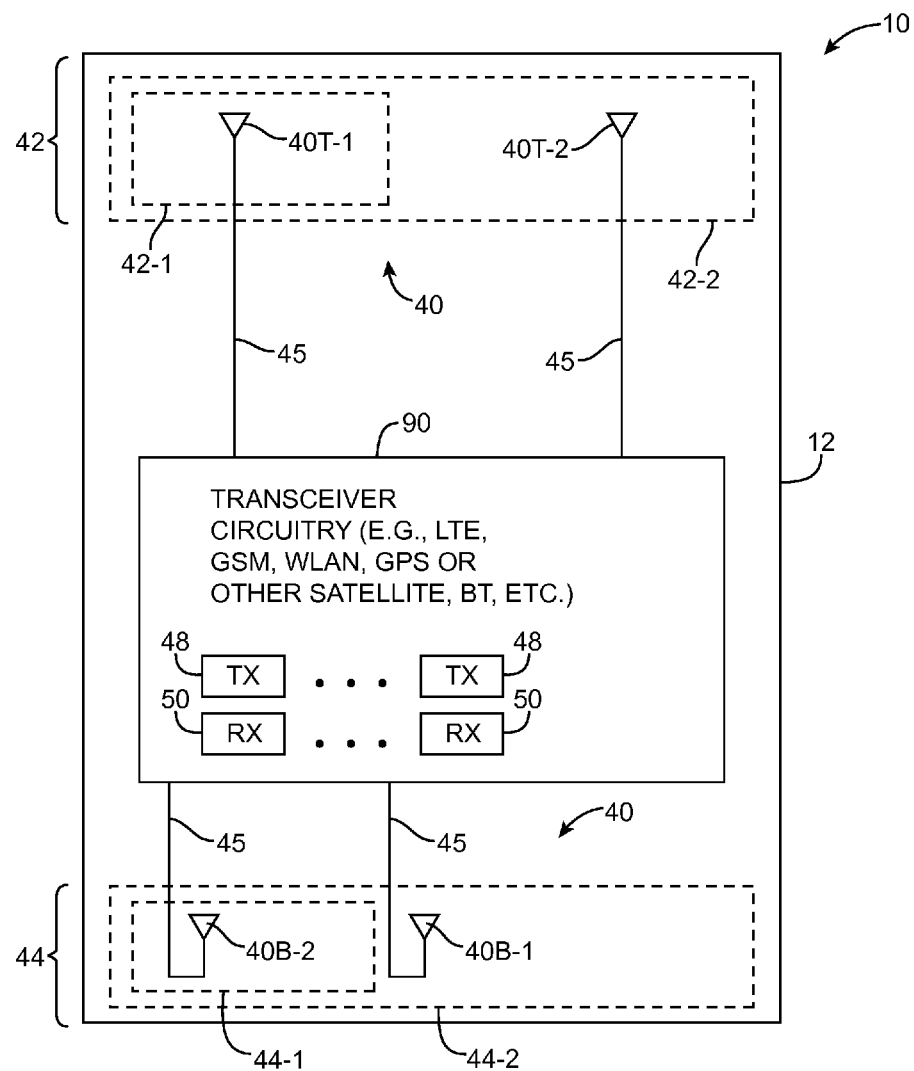
FIG. 2 is a diagram showing how radio-frequency transceiver circuitry may be coupled to one or more antennas within an electronic device of the type shown in FIG. 1 in accordance with an embodiment of the present invention.

Illustrative locations in which antennas 40 may be formed in device 10 are shown in FIG. 2. As shown in FIG. 2, electronic device 10 may have a housing such as housing 12. Housing 12 may include plastic walls, metal housing structures, structures formed from carbon-fiber materials or other composites, glass, ceramics, or other suitable materials. Housing 12 may be formed using a single piece of material (e.g., using a unibody configuration) or may be formed from a frame, housing walls, and other individual parts that are assembled to form a completed housing structure. The components of device 10 that are shown in FIG. 1 may be mounted within housing 12. Antenna structures 40 may be mounted within housing 12 and may, if desired, be formed using parts of housing 12. For example, housing 12 may include metal housing sidewalls, peripheral conductive members such as band-shaped members (with or without dielectric gaps), conductive bezels, and other conductive structures that may be used in forming antenna structures 40.

As shown in FIG. 2, antenna structures 40 may be coupled to transceiver circuitry 90 by paths such as paths 45. Paths 45 may include transmission line structures such as coaxial cables, microstrip transmission lines, stripline transmission lines, etc. Impedance matching circuitry, filter circuitry, and switching circuitry may be interposed in paths 45 (as examples). Impedance matching circuitry may be used to ensure that antennas 40 are efficiently coupled to transceiver circuitry 90 in desired frequency bands of interest. Filter circuitry may be used to implement frequency-based multiplexing circuits such as diplexers, duplexers, and triplexers. Switching circuitry may be used to selectively couple antennas 40 to desired ports of transceiver circuitry 90. For example, a switch may be configured to route one of paths 45 to a given antenna in one operating mode. In another operating mode, the switch may be configured to route a different one of paths 45 to the given antenna. The use of switching circuitry between transceiver circuitry 90 and antennas 40 allows device 10 to switch particular antennas 40 in and out of use depending on the current performance associated with each of the antennas.

In a device such as a cellular telephone that has an elongated rectangular outline, it may be desirable to place antennas 40 at one or both ends of the device. As shown in FIG. 2, for example, some of antennas 40 may be placed in upper end region 42 of housing 12 and some of antennas 40 may be placed in lower end region 44 of housing 12. The antenna structures in device 10 may include a single antenna in region 42, a single antenna in region 44, multiple antennas in region 42, multiple antennas in region 44, or may include one or more antennas located elsewhere in housing 12.

Antenna structures 40 may be formed within some or all of regions such as regions 42 and 44. For example, an antenna such as antenna 40T-1 may be located within region 42-1 or an antenna such as antenna 40T-2 may be formed that fills some or all of region 42-2. Similarly, an antenna such as antenna 40B-1 may fill some or all of region 44-2 or an antenna such as antenna 40B-2 may be formed in region 44-1. These types of arrangements need not be mutually exclusive. For example, region 44 may contain a first antenna such as antenna 40B-1 and a second antenna such as antenna 40B-2.

Transceiver circuitry 90 may contain transmitters such as radio-frequency transmitters 48 and receivers such as radio-frequency receivers 50. Transmitters 48 and receivers 50 may be implemented using one or more integrated circuits (e.g., cellular telephone communications circuits, wireless local area network communications circuits, circuits for Bluetooth® communications, circuits for receiving satellite navigation system signals, power amplifier circuits for increasing transmitted signal power, low noise amplifier circuits for increasing signal power in received signals, other suitable wireless communications circuits, and combinations of these circuits).

Figure 3:
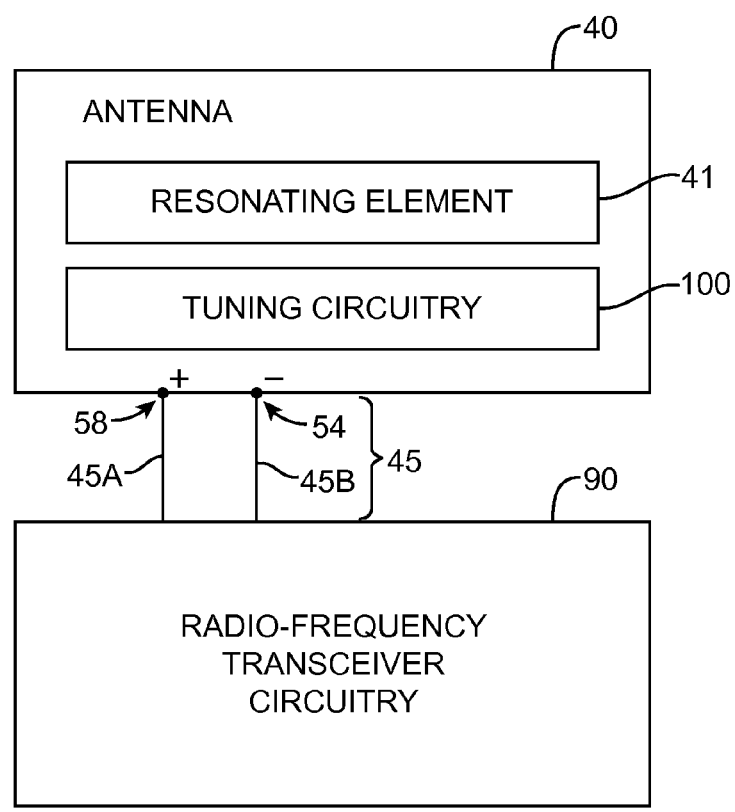
FIG. 3 is a circuit diagram showing how an antenna in the electronic device of FIG. 1 may be coupled to radio-frequency transceiver circuitry in accordance with an embodiment of the present invention.

FIG. 3 is a diagram showing how radio-frequency path 45 may be used to convey radio-frequency signals between an antenna 40 and radio-frequency transceiver 91. Antenna 40 may be one of the antennas of FIG. 2 (e.g., antenna, 40T-1, 40T-2, 40B-1, 40B-2, or other antennas). Radio-frequency transceiver 91 may include receivers and/or transmitters in transceiver circuitry 90, wireless local area network transceiver 36 (e.g., a transceiver operating at 2.4 GHz, 5 GHz, 60 GHz, or other suitable frequency), cellular telephone transceiver 38, or other radio-frequency transceiver circuitry for receiving and/or transmitting radio-frequency signals.

Conductive path 45 may include one or more transmission lines such as one or more segments of coaxial cable, one or more segments of microstrip transmission line, one or more segments of stripline transmission line, or other transmission line structures. Path 45 may include a first conductor such as signal line 45A and may include a second conductor such as ground line 45B. Antenna 40 may have an antenna feed with a positive antenna feed terminal 58 (+) that is coupled to signal path 45A and a ground antenna feed terminal 54 (−) that is coupled to ground path 45B. If desired, circuitry such as filters, impedance matching circuits, switches, amplifiers, and other radio-frequency circuits may be interposed within path 45.

As shown in FIG. 3, antenna 40 may include a resonating element 41 and antenna tuning circuitry. Resonating element 41 may be formed from a loop antenna structure, patch antenna structure, inverted-F antenna structure, slot antenna structures, planar inverted-F antenna structures, helical antenna structures, hybrids of these designs, etc. The use of antenna tuning circuitry may help device 10 cover a wider range of communications frequencies than would otherwise be possible.

In general, it is desirable for device 10 to be able to exhibit wide band coverage (e.g., for device 10 to be able to support operation in multiple frequency bands corresponding to different radio access technologies). For example, it may be desirable for antenna 40 to be capable of operating in a higher frequency band that covers the GSM sub-bands at 1800 MHz and 1900 MHz and the data sub-band at 2100 MHz, a first lower frequency band that covers the GSM sub-bands at 850 MHz and 900 MHz, and a second lower frequency band that covers the LTE band at 700 MHz, the GSM sub-bands at 710 MHz and 750 MHz, the UMTS sub-band at 700 MHz, and other desired wireless communications bands.

The band coverage of antenna 40 may be limited by its volume (i.e., the amount of space that is occupied by antenna 40 within housing 12). For an antenna having a given volume, a higher band coverage (or bandwidth) results in a decrease in gain (e.g., the product of maximum gain and bandwidth is constant). As a result, increasing the volume of antenna 40 will generally increase its band coverage. Increasing the volume of antennas, however, may not always be feasible if a small form factor is desired.

To satisfy consumer demand for small form factor wireless devices, one or more of antennas 40 may be provided with antenna tuning circuitry. The antenna tuning circuitry may include a radio-frequency tunable component such as tunable component (sometimes referred to as an adjustable antenna tuning element) 100 and an associated control circuitry such as control circuit 102 (see, e.g., FIG. 3). Tunable element 100 and/or control circuit 102 may sometimes be formed as an integral part of antenna resonating element 41 or as a separate discrete surface-mount component that is attached to antenna resonating element 41.

For example, antenna tuning element 100 may include switching circuitry based on one or more switches or continuously tunable load components. Control circuit 102 may be used to place tunable element 100 in the desired state by sending appropriate control signals Vc via path 104. The switching circuitry may, for example, include a switch that can be placed in an open or closed position. When the switch is placed in its open position (e.g., when control signal Vc has a first value), antenna 40 may exhibit a first frequency response. When the switch is placed in its closed position (e.g., when control signal Vc has a second value that is different than the first value), antenna 40 may exhibit a second frequency response. By using an antenna tuning scheme of this type, a relatively narrow bandwidth (and potentially compact) design can be used for antenna 40, if desired.

Figure 4A:
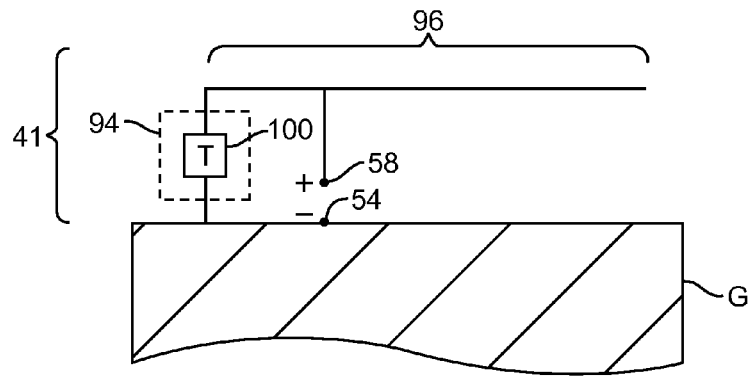
FIGS. 4A, 4B, and 4C are schematic diagrams of an illustrative inverted-F antenna containing antenna tuning elements in accordance with an embodiment of the present invention.

In one suitable embodiment of the present invention, antenna 40 may be an inverted-F antenna. FIG. 4A is a schematic diagram of an inverted-F antenna that may be used in device 10. As shown in FIG. 4A, inverted-F antenna 40 may have an antenna resonating element such as antenna resonating element 41 and a ground structure such as ground G.

Antenna resonating element 41 may have a main resonating element arm such as arm 96. Short circuit branch such as shorting path 94 may couple arm 96 to ground G. An antenna feed may contain positive antenna feed terminal 58 (+) and ground antenna feed terminal 54 (−). Positive antenna feed terminal 58 may be coupled to arm 96, whereas ground antenna feed terminal 54 may be coupled to ground G. Arm 96 in the FIG. 4A example is shown as being a single straight segment. This is merely illustrative. Arm 96 may have multiple bends with curved and/or straight segments, if desired.

In the example of FIG. 4A, inverted-F antenna 40 may include an antenna tuning element 100 interposed in shorting path 94. Antenna tuning element 100 may, for example, be a switchable impedance matching network, a switchable inductive network, a continuously tunable capacitive circuit, etc.

Figure 4B:
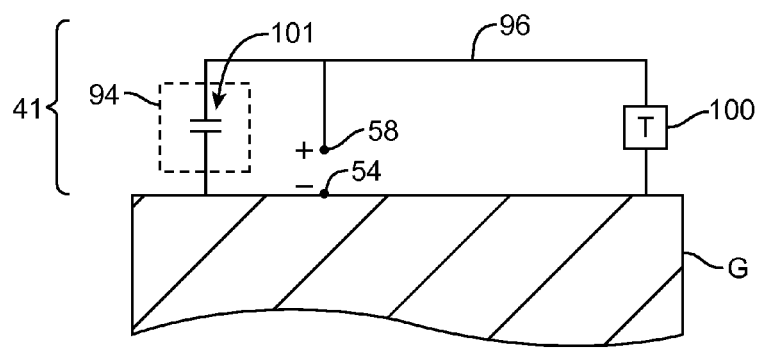

In another suitable arrangement of the present invention, resonating element 41 of inverted-F antenna 40 may include an antenna tuning element 100 coupled between the extended portion of resonating arm 96 and ground G (see, e.g., FIG. 4B). In such an arrangement, a capacitive structure such as capacitor 101 may be interposed in shorting path 94 so that antenna tuning circuit 100 is not shorted to ground at low frequencies. In the example of FIG. 4B, antenna tuning element 100 may be a switchable inductor, a continuously tunable capacitive/resistive circuit, etc.

Figure 4C:
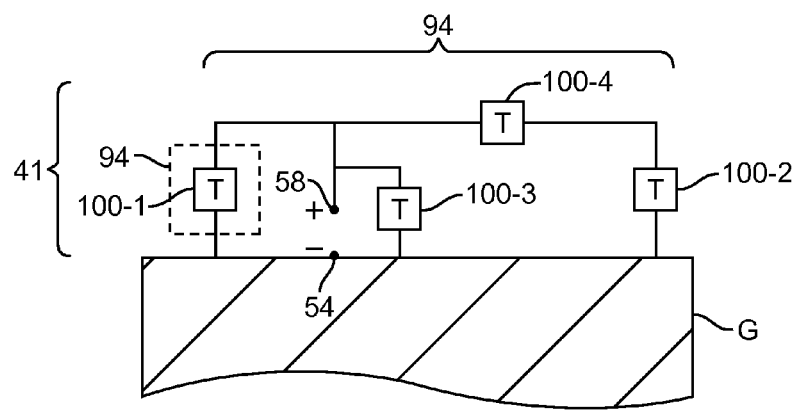

In general, antenna 40 may include any number of antenna tuning elements 100. As shown in FIG. 4C, short circuit branch 94 may include at least one tunable element 100-1 that couples arm 96 to ground. Tunable element 100-1 may be a switchable inductive path, as an example (e.g., element 100-1 may be activated to short arm 96 to ground). If desired, antenna tuning element 100-3 may be coupled in parallel with the antenna feed between positive antenna feed terminal 58 and ground feed terminal 54. Tunable element 100-3 may be an adjustable impedance matching network circuit, as an example.

As another example, antenna tuning element 100-4 may be interposed in antenna resonating arm 96. Antenna tuning element 100-4 may be a continuously adjustable variable capacitor (as an example). If desired, additional tuning elements such tuning element 100-2 (e.g., continuously tunable or semi-continuously tunable capacitors, switchable inductors, etc.) may be coupled between the extended portion of arm 96 to ground G.

The placement of these tuning circuits 100 in FIGS. 4A, 4B, and 4C is merely illustrative and do not serve to limit the scope of the present invention. Additional capacitors and/or inductors may be added to ensure that each antenna tuning circuit 100 is not shorted circuited to ground at low frequencies (e.g., frequencies below 100 MHz). In general, antennas 40 in device 10 may include antennas with resonating elements that are formed from loop antenna structures, patch antenna structures, inverted-F antenna structures, slot antenna structures, planar inverted-F antenna structures, helical antenna structures, hybrids of these designs, etc. At least a portion of antennas 40 in device 10 may contain at least one antenna tuning element 100 (formed at any suitable location on the antenna) that can be adjusted so that wireless circuitry 34 may be able to cover the desired range of communications frequencies.

Figure 5A:
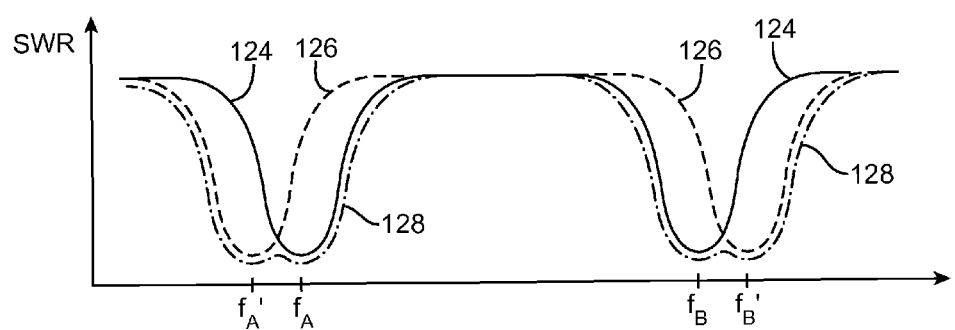
FIGS. 5A and 5B are plots showing how antennas containing tunable elements may be used to cover multiple communications bands of interest in accordance with an embodiment of the present invention.

By dynamically controlling antenna tuning elements 100, antenna 40 may be able to cover a wider range of radio-frequency communications frequencies than would otherwise be possible. A standing-wave-ratio (SWR) versus frequency plot such as SWR plot of FIG. 5A illustrates the band tuning capability for antenna 40. As shown in FIG. 5A, solid SWR frequency characteristic curve 124 corresponds to a first antenna tuning mode in which antenna 40 exhibits satisfactory resonant peaks at low-band frequency $f_A$ (e.g., to cover the 850 MHz band) and high-band frequency $f_B$ (e.g., to cover the 1900 MHz band). In the first antenna tuning mode, the antenna tuning elements 100 of antenna 40 may be placed in a first configuration (e.g., antenna tuning elements 100 may be provided with a first set of control signals).

Dotted SWR frequency characteristic curve 126 corresponds to a second antenna tuning mode in which the antennas of device 10 exhibits satisfactory resonant peaks at low-band frequency $f_A'$ (e.g., to cover the 750 MHz band) and high-band frequency $f_B'$ (e.g., to cover the 2100 MHz band). In the second antenna tuning mode, the antenna tuning elements 100 may be placed in a second configuration that is different than the first configuration (e.g., antenna tuning circuits 100 may be provided with a second set of control signals that is different than the first set of control signals).

If desired, antenna 40 may be placed in a third antenna tuning mode in which antenna 40 exhibits satisfactory resonant peaks at both low-band frequencies $f_A'$ and $f_A$ (e.g., to cover both the 750 and 850 MHz bands) and at high-band frequencies $f_B$ and $f_B'$ (e.g., to cover both the 1900 and 2100 MHz bands), as shown by SWR characteristic curve 128. In the third antenna tuning mode, the antenna tuning elements 100 may be placed in a third configuration that is different than the first and second configurations (e.g., antenna tuning elements 100 may be provided with a third set of control signals that is different than the first and second sets of control signals). A combination of tuning methods may be used so that the resonance curve 128 exhibits broader frequency ranges than curves 124 and 126.

Figure 5B:
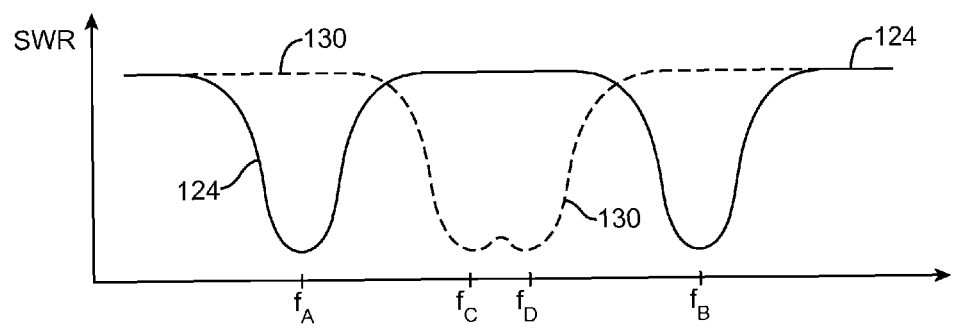

In another suitable arrangement, antenna 40 may be placed in a fourth antenna tuning mode in which antenna 40 exhibits satisfactory resonant peaks at mid-band frequencies $f_C$ and $f_D$ (e.g., to cover frequencies between the low and high bands), as shown by SWR characteristic curve 130 of FIG. 5B. In the fourth antenna tuning mode, the antenna tuning circuits 100 may yet be placed in another different configuration. The SWR curves of FIGS. 5A and 5B are merely illustrative and do not serve to limit the scope of the present invention. In general, antenna(s) 40 may include antenna tuning circuits 100 that enable device 10 to transmit and receive wireless signals in any suitable number of radio-frequency communications bands.

Figure 6A:
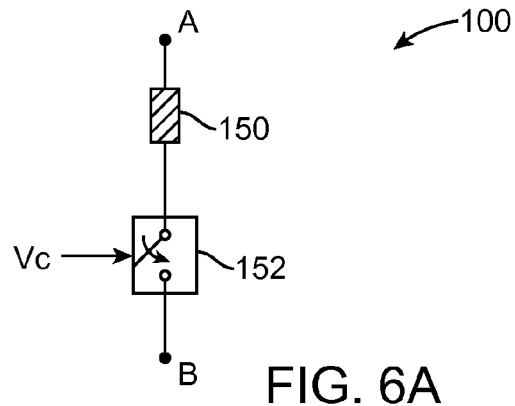
FIGS. 6A and 6B are circuit diagrams of illustrative switchable load circuits that may be used as antenna tuning elements in accordance with an embodiment of the present invention.

Antenna tuning element 100 may be any switchable or tunable electrical component that can be adjusted in real time. Antenna tuning element 100 may have a first terminal A and a second terminal B that may be coupled to desired locations on antenna resonating element 41 and a third terminal operable to receive control signal Vc from control circuit 102. FIG. 6A shows one suitable circuit implementation of tunable element 100. As shown in FIG. 6A, element 100 may include a radio-frequency switch 150 and a load circuit 152 coupled in series between terminals A and B. Switch 152 may be implemented using a p-i-n diode, a gallium arsenide field-effect transistor (FET), a microelectromechanical systems (MEMs) switch, a metal-oxide-semiconductor field-effect transistor (MOSFET), a high-electron mobility transistor (HEMT), a pseudomorphic HEMT (PHEMT), a transistor formed on a silicon-on-insulator (SOI) substrate, etc. The state of the switch can be controlled using signal Vc generated from control circuit 102 (see, e.g., FIG. 3). For example, a high Vc will turn on or close switch 402 whereas a low Vc will turn off or open switch 402.

Load circuit 152 may be formed from one or more electrical components. Components that may be used as all or part of circuit 152 include resistors, inductors, and capacitors. Desired resistances, inductances, and capacitances for circuit 152 may be formed using integrated circuits, using discrete components (e.g., a surface mount technology inductor) and/or using dielectric and conductive structures that are not part of a discrete component or an integrated circuit. For example, a resistance can be formed using thin lines of a resistive metal alloy, capacitance can be formed by spacing two conductive pads close to each other that are separated by a dielectric, and an inductance can be formed by creating a conductive path (e.g., a transmission line) on a printed circuit board.

Figure 6B:
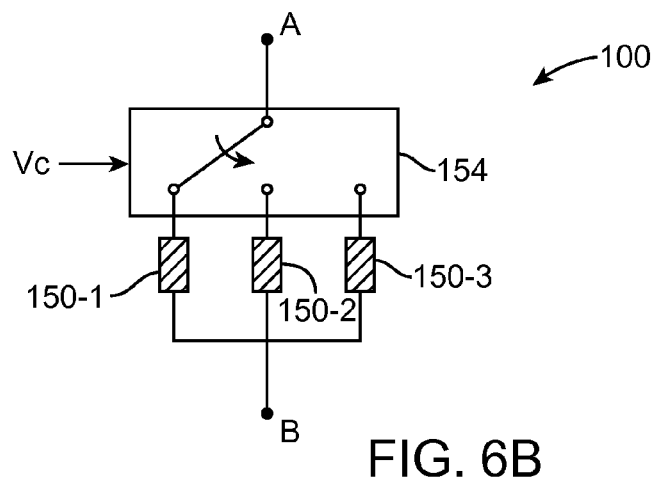

In another suitable arrangement, tunable element 100 may include a switch 154 (e.g., a single-pole triple-throw radio-frequency switch) and multiple load circuits 150-1, 150-2, and 150-3. As shown in FIG. 6B, switch 154 may have ports P1, P2, P3, and P4. Terminal B of tunable element 100 may be coupled to port P1 while terminal A of tunable element 100 may be coupled to port P2 via circuit 150-1, to port P3 via circuit 150-2, and to port P4 via circuit 150-3. As described previously, load circuits 150-1, 150-2, and 150-3 may include any desired combination of resistive components, inductive components, and capacitive components formed using integrated circuits, discrete components, or other suitable conductive structures. Switch 154 may be controlled using signal Vc generated by control circuit 102. For example, switch 154 may be configured to couple port P1 to P2 when Vc is at a first value, to couple port P1 to P3 when Vc is at a second value that is different than the first value, and to couple port P1 to P4 when Vc is at a third value that is different than the first and second values.

The example of FIG. 6B in which tunable element 100 includes three impedance loading circuits is merely illustrative and does not serve to limit the scope of the present invention. If desired, tunable element 100 may include a radio-frequency switch having any number of ports configured to support switching among any desired number of loading circuits. If desired, switch 154 may be configured such that more than one of the multiple loading circuits 150 may be coupled to port P1 in parallel.

Figure 6C:
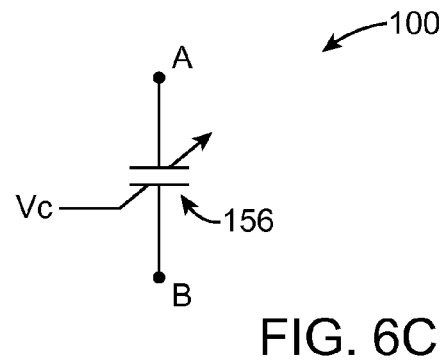
FIG. 6C is a circuit diagram of an illustrative variable capacitor circuit that may be used as an antenna tuning element in accordance with an embodiment of the present invention.

In another suitable arrangement, tunable element 100 may include a variable capacitor circuit 156 (sometimes referred to as a varactor). As shown in FIG. 6C, varactor may have first terminal A, second terminal B, and a control terminal operable to receive signal Vc from control circuit 300. Control circuit 102 may be adjusted so that Vc adjusts the capacitance of varactor 156 to the desired amount. Varactor 156 may be formed using integrated circuits, one or more discrete components (e.g., SMT components), etc. In general, varactor 156 may be continuously variable capacitors or semi-continuously adjustable capacitors.

It may be desirable to have a way of characterizing the performance of antenna tuning element 100 to determine its behavior when assembled within device 10. One way of testing the performance of antenna tuning element 100 involves mounting antenna tuning element 100 within an actual device 10 so that antenna tuning element 100 is placed in its true application environment (e.g., antenna tuning element 100 is placed in its intended assembled state, enabling element 100 to be presented with actual loading and operating conditions).

Figure 7:
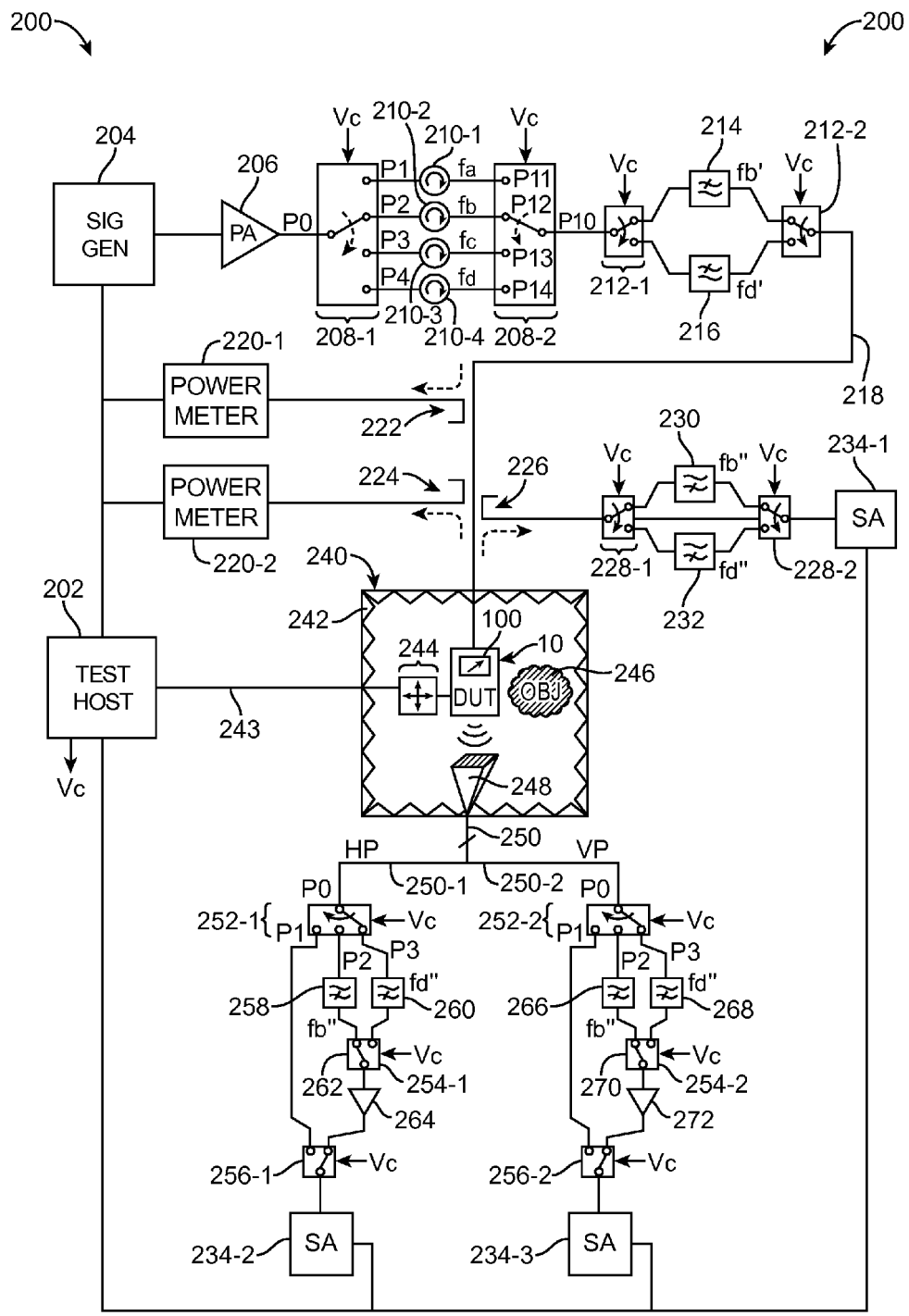
FIG. 7 is a diagram of an illustrative test system for characterizing an electronic device having an antenna tuning element in accordance with an embodiment of the present invention.

FIG. 7 shows a test system such as test system (sometimes referred to as a test station) 200 that can be used to test device 10 that includes at least one antenna tuning element 100. Electronic device 10 that is being tested may be referred to as a device under test (DUT). As shown in FIG. 7, test system 200 may include a test host such as test host 202, a test chamber such as test chamber 240, a signal generator such as signal generator 204, testers such as testers 220 and 234 (e.g., power meters 220-1 and 220-2 and spectrum analyzers 234-1, 234-2, and 234-3), and other radio-frequency test equipment. Test host 202 may, for example, be a host personal computer or other types of computing equipment that can be used to control the operation of signal generator 204, power meters 220, spectrum analyzers 234, and other test accessories in test system 200.

DUT 10 may be placed within test chamber 240 during test operations. Test chamber 240 may have a cubic structure (six square walls) or a rectangular prism-like structure (six rectangular walls), if desired. Test chamber 240 may be internally lined with absorbent material. The absorbent material may be formed from pyramid-shaped foams (see, e.g., liner 242), rubberized material, or other suitably lossy material. Test chamber 240 may sometimes be referred to as an anechoic chamber. If desired, reverberation chambers (e.g., chambers with one or more tuners that can be moved to different orientations to obtain varying spatial distribution of electrical and magnetic field strength) may also be used.

DUT 10 may be attached to a positioner such as positioner 244 when DUT 10 is placed within test chamber 240. Positioner 244 is a computer-controlled or manually-controlled positioning device that can be used to change the position/orientation of DUT 10 within test chamber 240 during testing. For example, positioner 244 may include actuators for controlling lateral and/or rotational movement of DUT 10 and may therefore sometimes be referred to as a DUT rotator. DUT rotator 244 may be controlled using control signals generated by test host 100 routed over path 243.

Signal generator 204 may be used for generating radio-frequency test signals at desired fundamental frequencies (e.g., frequencies at which device 10 may operate during normal wireless transmission). These test signals may be provided to DUT 100 via a coaxial cable, radio-frequency transmission line path, and/or other suitable conductive paths. If desired, signal generator 204 may be a radio communications tester of the type that is sometimes referred to as a call box or a base station emulator.

Signal generator 204 may be operated directly or via computer control (e.g., when signal generator 204 receives commands from test host 202). When operated directly, a user may control signal generator 204 by supplying commands directly to the signal generator using a user input interface of signal generator 204. For example, a user may press buttons in a control panel on the signal generator while viewing information that is displayed on a display in generator 204. In computer controlled configurations, test host 202 (e.g., software running autonomously or semi-autonomously on the computer) may communicate with signal generator 204 (e.g., by sending and receiving data over a wired path or a wireless path between the computer and the signal generator).

Signal generator my provide radio-frequency test signals to an amplifying circuit such as radio-frequency power amplifier 206. Power amplifier 206 may be used to amplify the radio-frequency test signals so that test signals are delivered to DUT 10 at the desired power level. The gain provided by power amplifier 206 may be controlled using test host 202. For example, consider a scenario in which the desired power to be delivered to DUT 10 is equal to 20 dBm during a first test iteration and is equal to 45 dBm during a second test iteration. Power amplifier 206 may be configured to provide a first signal gain during the first test iteration and may be configured to provide a second signal gain that is greater than the first signal gain during the second test iteration (e.g., radio-frequency power amplifier may provide more gain when the requested power to be delivered to DUT 10 is higher).

The amplified radio-frequency test signals at the output of power amplifier 206 may be output to an input port P0 of radio-frequency switch 208-1 (e.g., a first single-pole quadruple-throw radio-frequency switch). Signals received at port P0 may be routed to a selected one of output ports P1, P2, P3, and P4. Test host 202 may generate a control signal Vc that can be used to place switch 208-1 in a desired state. In the example of FIG. 7 in which switch 208-1 is operable in four different states, signal Vc may be a two-bit digital signal. When test host 202 sets Vc to be equal to "00," port P0 may be coupled to P1 (e.g., switch 208-1 may be placed in a first state). When test host 202 sets Vc to be equal to "01," port P0 may be coupled to P2 (e.g., switch 208-1 may be placed in a second state). When test host 202 sets Vc to be equal to "10," port P0 may be coupled to P3 (e.g., switch 208-1 may be placed in a third state). When test host 202 sets Vc to be equal to "11," port P0 may be coupled to P4 (e.g., switch 208-1 may be placed in a fourth state).

Output ports P1-P4 of switch 208-1 may be coupled to corresponding ports P11, P12, P13, and P14 of radio-frequency switch 208-2 (e.g., a second single-pole quadruple-throw radio-frequency switch) via respective radio-frequency isolator circuits. Port P1 of switch 208-1 may be coupled to port P11 of switch 208-2 via a first radio-frequency isolator 210-1; port P2 of switch 208-1 may be coupled to port P12 of switch 208-2 via a second radio-frequency isolator 210-2; port P3 of switch 208-1 may be coupled to port P13 of switch 208-2 via a third radio-frequency isolator 210-3; and port P4 of switch 208-1 may be coupled to port P14 of switch 208-2 via a fourth radio-frequency isolator 210-4.

First isolator circuit 210-1 may be configured to selectively pass radio-frequency signals at frequency fa while preventing any signals reflected back via port P11 from leaking back to power amplifier 206 (e.g., signals reflected from DUT 10 may be drained to a ground terminal of the isolator). Second isolator circuit 210-2 may be configured to selectively pass radio-frequency signals at frequency fb while preventing any reflected signals from leaking back to power amplifier 206 via port P12. Third isolator circuit 210-3 may be configured to selectively pass radio-frequency signals at frequency fc while preventing any reflected signals from leaking back to power amplifier 206 via port P13. Fourth isolator circuit 210-4 may be configured to selectively pass radio-frequency signals at frequency fd while preventing any reflected signals from leaking back to power amplifier 206 via port P14. If desired, radio-frequency band-pass filters may be used in place of the isolators to provide desired frequency selectivity.

Radio-frequency switch 208-2 may be configured to selectively couple one of ports P11-P14 to its output port P10. For example, switch 208-2 may receive a two-bit digital signal Vc from test host 202. When test host 202 sets Vc to be equal to "00," port P10 may be coupled to P11 (e.g., switch 208-2 may be placed in a first state). When test host 202 sets Vc to be equal to "01," port P10 may be coupled to P12 (e.g., switch 208-2 may be placed in a second state). When test host 202 sets Vc to be equal to "10," port P10 may be coupled to P13 (e.g., switch 208-2 may be placed in a third state). When test host 202 sets Vc to be equal to "11," port P10 may be coupled to P14 (e.g., switch 208-2 may be placed in a fourth state).

Frequencies fa, fb, fc, and fb represent desired fundamental operating frequencies to be tested and may be equal to 750 MHz, 900 MHz, 1950 MHz, and 2100 MHz, respectively (as an example). Frequency fa may be less than fb, fb may be less than fc, and fc may be less than fd. The example of FIG. 7 in which switches 208-1 and 208-2 are configurable in four different states is merely illustrative and does not serve to limit the scope of the present invention. If desired, switches 208-1 and 208-2 may include any number of ports for performing switching among any suitable number of radio-frequency channels and bands.

Port P10 of switch 208-2 may be coupled to a first terminal of radio-frequency switch 212-1 (e.g., a first single-pole double-throw radio-frequency switch). The first terminal of radio-frequency switch 212-1 may be switchably coupled to a selected one of a second terminal and a third terminal of switch 212-1. The state of switch 212-1 (i.e., whether the first terminal is connected to the second terminal or whether the first terminal is connected to the third terminal) may be controlled using control signal Vc generated using test host 202.

Switch 212-1 may be coupled to switch 212-2 (e.g., a second single-pole double-throw radio-frequency switch) via respective low pass filters. In particular, switch 212-2 may have a first terminal that is coupled to DUT 10 via path 218, a second terminal that is coupled to the second terminal of switch 212-1 via first low pass filter circuit 214, and a third terminal that is coupled to the third terminal of switch 212-1 via second low pass filter 216. The state of switch 212-2 (i.e., whether the first terminal is connected to the second terminal or whether the first terminal is connected to the third terminal) may be controlled using control signal Vc generated from test host 202.

Filter 214 may be switched into use when radio-frequency switches 208 (i.e., switches 208-1 and 208-2) are placed in the first and second states while filter 216 is switched out of use. Filter 216 may be switched into use when radio-frequency switches 208 are placed in the third and fourth states while filter 214 is switched out of use. Filter 214 may have a cutoff frequency of fb' (i.e., radio-frequency signals greater than fb' will be attenuated), where frequency fb' is greater than fb but less than fc. Filter 214 may therefore be used to attenuate spurious signals at harmonic frequencies (e.g., frequencies that are integer multiples of fundamental frequency fa or fb) that may have been generated due to the non-linear behavior of the test equipment interposed between switch 212-1 and signal generator 204. Filter 216 may have a cutoff frequency of fd' (i.e., radio-frequency signals greater than fd' will be attenuate), where frequency fd' is greater than fd. Filter 216 may therefore be used to attenuate spurious emissions at harmonic frequencies (e.g., frequencies that are integer multiples of fundamental frequency fc or fd).

Power meter 220-1 may be coupled to path 218 via broadband radio-frequency coupler 222. Coupler 222 may be used to divert a small fraction of the transmitted radio-frequency test signals that are being conveyed from switch 212-2 to DUT 10. As an example, coupler 222 may be a −20 dB coupler and may be used to extract one percent of the delivered powered with which the signals are being transmitted to DUT 10. A power reading of −5 dBm may therefore translate to an actual delivered power level of 15 dBm (−5 plus 20), whereas a power reading of 13 dBm may translate to an actual delivered power level of 33 dBm (13 plus 20). The term "actual delivered power level" refers to the output power level at which the radio-frequency signals are being delivered to DUT 10.

Power meter 220-2 may be coupled to path 218 via broadband radio-frequency coupler 224. Coupler 224 may be used to divert a small fraction of the signals that have been reflected back from DUT 10. Coupler 224 may also be a −20 dB coupler (as an example). Power meters 220 (i.e., power meters 220-1 and 220-2) may include radio-frequency receiver circuitry that is able to gather information on the magnitude and phase of signals transmitted to and reflected from DUT 10 (i.e., radio-frequency signals that are reflected from DUT 10 or radio-frequency signals that have passed through at least a portion of DUT 10).

By analyzing transmitted signals using power meter 220-1 and reflected signals using power meter 220-2, the magnitude and phase of the complex impedance (sometimes referred to as a reflection coefficient) of DUT 10 may be determined. For example, by analyzing the transmitted and reflected signals, power meters 220-1 and 220-2 may collectively be used to obtain linear measurements such as S-parameter measurements that reveal information about whether DUT 100 exhibits satisfactory radio-frequency performance. For example, S11 (complex impedance) measurements and/or an S21 (complex forward transfer coefficient) measurements may be obtained and computed using test host 202 based on data gathered using power meters 220. The values of S11 and S21 may be measured at desired fundamental frequencies.

Spectrum analyzer 234-1 may also be coupled to path 218 via broadband radio-frequency coupler 226. Coupler 226 may be used to divert a small fraction of the signals that have been reflected back from DUT 10 to spectrum analyzer 234-1. Coupler 224 may be a −20 dB coupler (as an example). As shown in FIG. 7, switches 228-1 and 228-2 and high pass filters 230 and 232 may be interposed between coupler 226 and spectrum analyzer 234-1. Spectrum analyzers such as spectrum analyzers 234-1, 234-2, and 234-3 may be a radio-frequency tester suitable for performing radio-frequency measurements on signals received from DUT 10. Results gathered using these testers 234 may be retrieved by test host 202 for further processing.

Switches 228-1 and 228-2 may be single-pole double-throw radio-frequency switches. Switch 228-1 may have a first terminal that is coupled to coupler 226, whereas switch 228-2 may have a first terminal that is coupled to spectrum analyzer 234-1. Switch 228-1 may have a second terminal that is coupled to a second terminal of switch 228-2 via filter 230 and may have a third terminal that is coupled to a third terminal of switch 228-2 via filter 232. Filter 230 may be used for selectively passing through signals having frequencies greater than fb" (e.g., signals wither frequencies fb" will be attenuated), whereas filter 232 may be used for selectively passing through signals having frequencies greater than fd" (e.g., signals wither frequencies fd" will be attenuated).

Filter 230 may be switched into use when radio-frequency switches 208 are placed in the first and second states while filter 232 is switched out of use (e.g., switches 228-1 and 228-2 may be configured to couple tester 234-1 to coupler 226 via filter 230). Configuring filter 230 in this way serves to attenuate signals at fundamental frequencies fa or fb while passing through signals at the harmonic frequencies (e.g., 2*fa, 3*fa, . . . , n*fa, 2*fb, 3*fb, . . . , n*fb). Frequency fb" may greater than fb and less than 2*fa (as an example).

Filter 232 may be switched into use when radio-frequency switches 208 are placed in the third and fourth states while filter 230 is switched out of use (e.g., switches 228-1 and 228-2 may be configured to couple tester 234-1 to coupler 226 via filter 232). Configuring filter 232 in this way serves to attenuate signals at fundamental frequencies fc or fd while passing through signals at the harmonic frequencies (e.g., 2*fc, 3*fc, . . . , n*fc, 2*fd, 3*fd, . . . , n*fd). Frequency fd" may greater than fd and less than 2*fc (as an example).

Test system 200 may be used to characterize how the presence of antenna tuning element 100 affects the antenna performance of DUT 10 (e.g., to determine whether antenna tuning element 100 contains a manufacturing defect). DUT 10 may or may not be powered on. In the scenario in which DUT is powered on, DUT 10 need not be placed in normal user mode (e.g., the radio-frequency transceiver circuitry is not actively transmitting wireless traffic). This type of testing in which DUT 10 is powered off or in idle mode may be referred to as passive antenna testing. During passive antenna testing, the antenna may be energized using a radio-frequency input test signal that is generated by signal generator 204 and fed to DUT 10. In particular, the input radio-frequency signal may be fed directly to antenna tuning element 100 via direct physical contact with a radio-frequency test probe that is connected to path 218 (as an example).

As described previously, power meters 220 and tester 234-1 may be used to measure signals conveyed along path 218 via direct conduction (e.g., signals are conveyed to the power meters and tester via conducted means). Simply obtaining conductive test measurements may not be sufficient in characterizing the antenna because no radiated signal from DUT 10 is measured. Certain defects in element 100 may cause a drop in antenna efficiency without a corresponding or measurable change to antenna input impedance (i.e., certain defects cannot be detected by simply monitoring S11). In these cases, only a radiated test is capable of detecting such variations. This requires a test antenna that samples signals radiated from DUT 10 within test chamber 240.

A test antenna such test antenna 248 may be placed within test chamber 240. Test antenna 248 may be used for receiving radio-frequency signals emanated from DUT 10 upon excitation from the input radio-frequency test signals that are conveyed to DUT 10 over path 218. Test antenna 248 may be a horn antenna, a patch antenna, or other types of radio-frequency wave guides. Radio-frequency signals received using test antenna 248 may be grouped into separate paths based on the polarization orientation. Horizontally polarized (HP) received signals may be fed to port P0 of radio-frequency switch 252-1 via path 250-1, whereas vertically polarized (VP) received signals may be fed to port P0 of radio-frequency switch 252-2 via path 250-2 (as an example).

Switch 252-1 may be coupled to a second spectrum analyzer 234-2 via radio-frequency switch 256-1, whereas switch 252-2 may be coupled to a third spectrum analyzer 234-3 via radio-frequency switch 256-2. Switches 252-1 and 252-2 may be single-pole triple-throw radio-frequency switches, whereas switches 256-1 and 256-2 may be single-pole double-throw radio-frequency switches.

Switch 256-1 may have a first terminal that is coupled to tester 234-2, a second terminal that is coupled to port P1 of switch 252-1, and a third terminal that is selectively coupled to one of ports P2 and P3 in switch 252-1. High pass filter circuits such as filters 258 and 260, radio-frequency switch 254-1 (e.g., a single-pole double-throw RF switch), and radio-frequency power amplifier 264 may be coupled between switch 252-1 and the third terminal of switch 256-1. In particular, switch 254-1 may have a first terminal that is coupled to the third terminal of switch 256-1 via power amplifier 264, a second terminal that is coupled to port P2 of switch 252-1 via filter 258, and a third terminal that is coupled to port P3 of switch 252-1 via filter 260. Only one of filters 258 and 260 may be switched into use at any given point in time. When switched into use, filter 258 may serve to attenuate signals having frequencies less than fb" and to pass through signals having frequencies greater than fb" (e.g., for passing through signals at harmonic frequencies associated with fundamental frequency fa or fb). When switched into use, filter 260 may serve to attenuate signals having frequencies less than fd" and to pass through signals having frequencies greater than fd" (e.g., for passing through signals at harmonic frequencies associated with fundamental frequency fc or fd). Power amplifier 264 may be used to amplify signals with sufficient gain such that signals arriving at tester 234-2 can be properly measured.

Test host 202 may configured switch 252-1 to coupled port P0 to P1 and may configured switch 256-1 to coupled its first terminal to its second terminal when performing linear radio-frequency measurements at the fundamental frequency currently being tested (e.g., fa, fb, fc, or fd). Switch 256-1 may be configured to couple its first terminal to its third terminal when performing non-linear radio-frequency measurements at the harmonic frequencies (i.e., when characterizing harmonic distortion levels). In particular, test host 202 may configure switch 252-1 to couple port P0 to P2 and may configure switch 254-1 to couple its first terminal to its second terminal when switches 208 are placed in the first or second state. Alternatively, test host 202 may configure switch 252-1 to couple port P0 to P3 and may configure switch 254-1 to couple its first terminal to its third terminal when switches 208 are placed in the third or fourth state. Radio-frequency measurements obtained using spectrum analyzer 234-2 may be reflective of the wireless behavior of horizontally polarized signals received via antenna 248.

The vertically polarized signals may be fed to spectrum analyzer 234-3 via path 250-2 and switches 252-2 and 256-2. Switch 256-2 may have a first terminal that is coupled to tester 234-3, a second terminal that is coupled to port P1 of switch 252-2, and a third terminal that is selectively coupled to one of ports P2 and P3 in switch 252-2. High pass filter circuits such as filters 266 and 268, radio-frequency switch 254-2 (e.g., a single-pole double-throw RF switch), and radio-frequency power amplifier 272 may be coupled between switch 252-2 and the third terminal of switch 256-2. In particular, switch 254-2 may have a first terminal that is coupled to the third terminal of switch 256-2 via power amplifier 272, a second terminal that is coupled to port P2 of switch 252-2 via filter 266, and a third terminal that is coupled to port P3 of switch 252-2 via filter 268. Only one of filters 266 and 268 may be switched into use at any given point in time. When switched into use, filter 266 may serve to attenuate signals having frequencies less than fb" and to pass through signals having frequencies greater than fb" (e.g., for passing through signals at harmonic frequencies associates with fundamental frequency fa or fb). When switched into use, filter 268 may serve to attenuate signals having frequencies less than fd" and to pass through signals having frequencies greater than fd" (e.g., for passing through signals at harmonic frequencies associated with fundamental frequency fc or fd). Power amplifier 272 may be used to amplify signals with sufficient gain such that signals arriving at tester 234-3 can be properly measured.

Test host 202 may configured switch 252-2 to coupled port P0 to P1 and may configured switch 256-2 to coupled its first terminal to its second terminal when performing linear radio-frequency measurements at the fundamental frequency currently being tested (e.g., fa, fb, fc, or fd). Switch 256-2 may be configured to couple its first terminal to its third terminal when performing non-linear radio-frequency measurements at the harmonic frequencies (i.e., when characterizing harmonic distortion levels). In particular, test host 202 may configure switch 252-2 to couple port P0 to P2 and may configure switch 254-2 to couple its first terminal to its second terminal when switches 208 are placed in the first or second state. Alternatively, test host 202 may configure switch 252-2 to couple port P0 to P3 and may configure switch 254-2 to couple its first terminal to its third terminal when switches 208 are placed in the third or fourth state. Radio-frequency measurements obtained using spectrum analyzer 234-3 may be reflective of the wireless behavior of vertically polarized signals received via antenna 248.

Test results obtained using both testers 234-2 and 234-3 may be retrieved and analyzed using test host 202 when determining whether antenna tuning element 100 satisfies design criteria. All the radio-frequency switches in test system 200 (e.g., switches 208, 212-1, 212-2, 228-1, 228-2, 252-1, 252-2, 254-1, 254-2, 256-1, and 256-2) may be controlled by test host 202 via adjustable signal Vc.

If desired, a physical object such as object 246 may be placed in the vicinity of DUT 10 during testing. The presence of object 246 may serve to simulate an actual user scenario in which a users hand or other body part(s) may impact the antenna performance of DUT 10. Object 246 may therefore sometimes be referred to as a phantom object. Positioner 244 may be used to vary the position and orientation of DUT 10 relative to object 246 during device characterization. If desired, object 246 may be formed using dielectric material, metal, ceramic, plastic, rubber, foam, or other suitable material. If desired, the position/orientation of object 246 may also be adjusted manually or automatically during testing.

Figure 8:
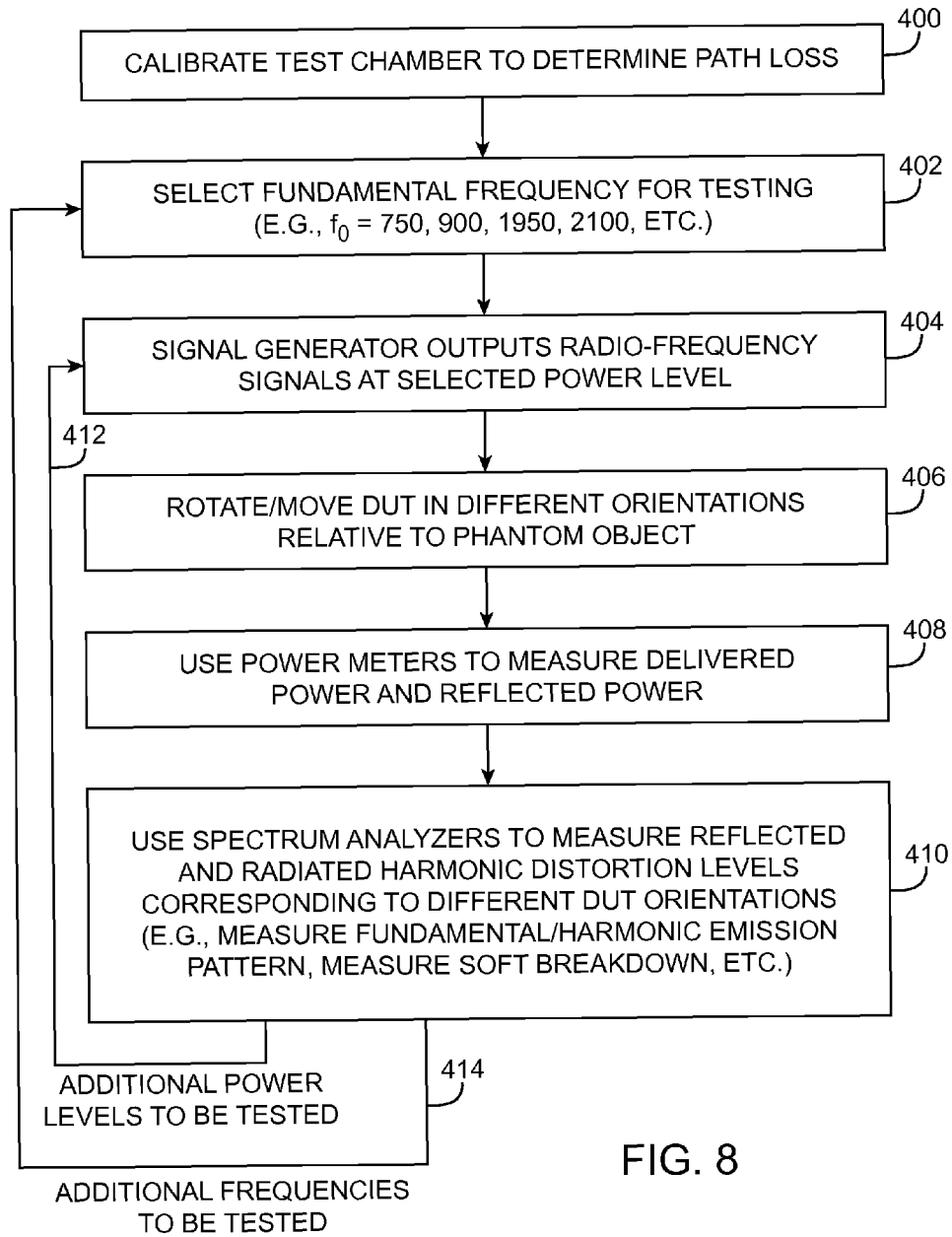
FIG. 8 is a flow chart of illustrative steps for using the test system of FIG. 7 in accordance with an embodiment of the present invention.

FIG. 8 is a flow chart of illustrative steps for using the test system of FIG. 7 to characterize DUT 10. At step 400, test chamber 240 may be calibrated to determine an associated path loss. Path loss may be defined as the amount of power attenuation experienced by signals propagating down a transmission line path. The path loss associated with test chamber 240 may therefore be defined as the amount of power attenuation experienced by signals traveling from the output of signal generator 204 to the corresponding test input contact point with DUT 10. This calibrated path loss value may be factored into the measured values to take into account path loss variation from test station to test station.

At step 402, test host 202 may select a fundamental frequency for testing (e.g., fundamental frequency $f_0$ may be set to fa, fb, fc, or fd). At step 404, test host 202 may configure signal generator 204 to output radio-frequency signals at a selected output power level. At step 406, positioner 244 may be used to rotate/move DUT 10 in different orientations and positions relative to phantom object 246.

While radio-frequency test signals are being fed to DUT 10 for energizing antenna tuning element 100 and while DUT 10 being placed in various orientations, power meters 220-1 and 220-2 may be used to measured delivered power and reflected power levels, respectively. Spectrum analyzer 234-1 may be used to measure different harmonic distortion levels in the reflected signals corresponding to different DUT orientations. Spectrum analyzers 234-2 and 234-3 may be used to measure different harmonic distortion levels in the radiated signals corresponding to the different DUT orientations. For example, the power meters and the spectrum analyzers may be used to collectively measure fundamental and harmonic emission patterns and to measure soft breakdown levels to determine whether antenna tuning element 100 satisfies design criteria.

If there are additional output power levels to be tested, processing may loop back to step 404 (as indicated by path 412). Processing may loop back to step 402 if there are additional fundamental frequencies to be tested, as indicated by path 414. The steps of FIG. 8 are merely illustrative and do not serve to limit the scope of the present invention. If desired, test system 200 may include any number of power meters, spectrum analyzers, filters, radio-frequency switches, and other radio-frequency test equipment for obtaining linear and nonlinear radio-frequency measurements at any number of desired frequencies.

Figure 9:
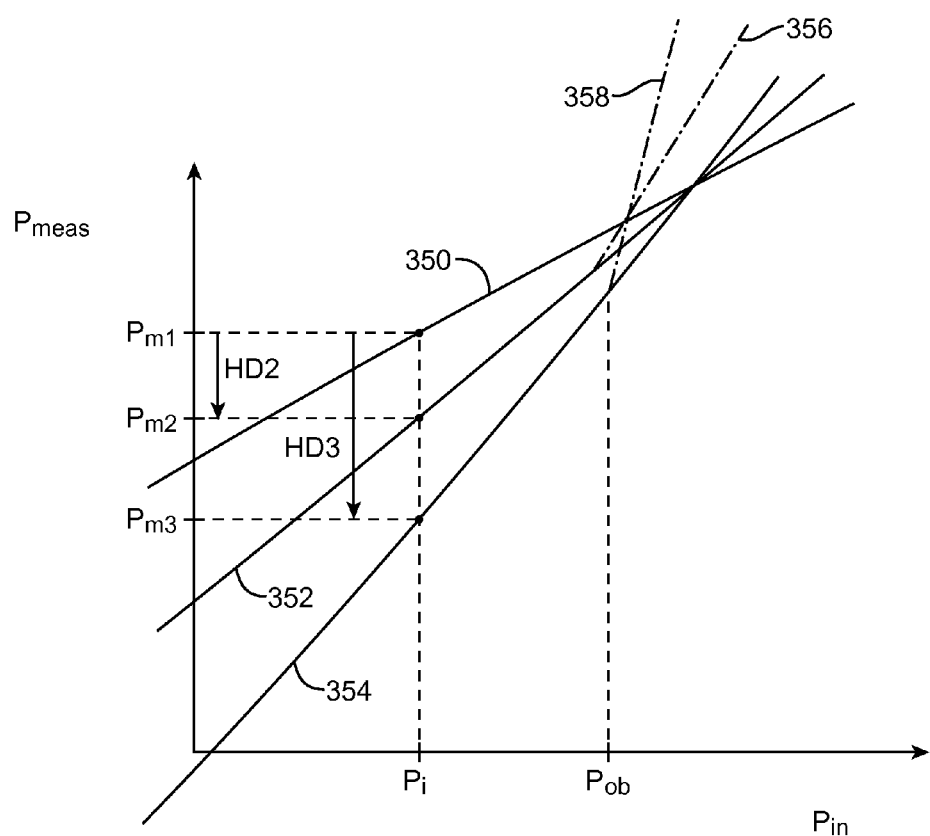
FIG. 9 is a plot showing measured power level versus input power level illustrating harmonic distortion in accordance with an embodiment of the present invention.

FIG. 9 is a plot showing measured power level Pmeas versus input power level Pin (i.e., power that is delivered to DUT 100) illustrating harmonic distortion measurements on a log scale (in units of dBm) for a given fundamental frequency. As shown in FIG. 9, line 350 plots the measured signal level at fundamental frequency $f_0$, line 352 plots the measured signal level at second harmonic frequency $2f_0$, and line 354 plots the measured signal level at third harmonic frequency $3f_0$. Generally, for a given input power, the output power level measured at $2f_0$ is less than the output power level measured at $f_0$. Similarly, the output power level measured at $3f_0$ is less than the output power level measured at $2f_0$ at the given input power level.

As illustrated in FIG. 9, a $2^{nd}$ harmonic distortion value HD2 may be defined as the ratio of the measured output power level at $2f_0$ corresponding to a given input power Pi to the measured output power level at $f_0$ corresponding to input power level Pi. A $3^{rd}$ harmonic distortion value HD3 may be defined as the ratio of the measured output power level at $3f_0$ corresponding to given input power Pi to the measured output power level at $f_0$ corresponding to power level Pi. In general, an $n^{th}$ harmonic distortion value HDn is defined as the ratio of output power level measured at the $n^{th}$ harmonic frequency $n*f_0$ to the output power level measured at the fundamental frequency $f_0$. Harmonic distortion values may be represented in units of dBc. Test host 202 may be used to compute these different order harmonic distortion values for each desired input power Pin.

Harmonic distortion values also tend to decrease as input power Pin is lowered. At a certain input power level, antenna tuning element 100 may experience reliability issues such as oxide breakdown or soft breakdown (e.g., a condition in which a semiconductor device in element 100 can no longer be controlled in a predictable manner). In the example, of FIG. 9, curves 352 and 354 may rise dramatically when Pin is raised beyond oxide break threshold power level Pob (as indicated by dotted lines 356 and 358, respectively). Oxide break threshold power level Pob may vary as a function of frequency, temperature, power supply level, and other factors that impact the operation of antenna tuning element 100. The computed oxide break threshold level Pob may be compared to a predetermined threshold to determine whether antenna tuning element satisfies device reliability requirements.

The foregoing is merely illustrative of the principles of this invention and various modifications can be made by those skilled in the art without departing from the scope and spirit of the invention. The foregoing embodiments may be implemented individually or in any combination.

What is claimed is:

1. A radio-frequency test system for testing an electronic device having an antenna, comprising:
   a signal generator configured to provide radio-frequency test signals to the antenna via an input line, wherein the antenna is disposed within a housing of the electronic device;
   a first radio-frequency tester configured to measure signals that are reflected back from the antenna on the input line as a result of providing the radio-frequency test signals with the signal generator; and
   a second radio-frequency tester configured to measure signals that are radiated from the antenna as a result of providing the radio-frequency test signals with the signal generator.

2. The radio-frequency test system defined in claim 1 wherein the antenna comprises a tunable antenna having an adjustable antenna tuning element.

3. The radio-frequency test system defined in claim 2 wherein the adjustable antenna tuning element comprises at least one adjustable circuit selected from the group consisting of: a radio-frequency switch, a tunable resistive component, a tunable capacitive component, and a tunable inductive component.

4. The radio-frequency test system defined in claim 3, further comprising:
an anechoic test chamber within which the electronic device is placed during testing.

5. The radio-frequency test system defined in claim 4, further comprising:
a phantom object placed within the anechoic test chamber, wherein the phantom object serves to simulate a user body part;
a positioner in the anechoic test chamber operable to place the electronic device in different positions relative to the phantom object during testing.

6. The radio-frequency test system defined in claim 4, further comprising:
a test antenna placed within the anechoic test chamber, wherein the test antenna is configured to receive the signals radiated from the antenna;
a radio-frequency power amplifier,
at least one radio-frequency switch; and
at least one filter circuit, wherein the radio-frequency power amplifier, the at least one radio-frequency switch, and the at least one filter circuit are coupled between the test antenna and the second radio-frequency tester.

7. The radio-frequency test system defined in claim 6, wherein the at least one filter circuit comprises a high pass filter circuit.

8. The radio-frequency test system defined in claim 3, further comprising:
a radio-frequency power amplifier,
at least one radio-frequency switch; and
at least one filter circuit, wherein the radio-frequency power amplifier, the at least one radio-frequency switch, and the at least one filter circuit are interposed in the input line between the signal generator and the antenna.

9. The radio-frequency test system defined in claim 8, wherein the at least one filter circuit comprises a low pass filter circuit.

10. The radio-frequency test system defined in claim 3, further comprising:
a first power meter configured to measure power levels for signals that are reflected back from the antenna on the input line as a result of providing the radio-frequency test signals with the signal generator; and
a second power meter configured to measure power levels for signals that are being delivered to the antenna on the input line.

11. A method for using a radio-frequency test system to test an electronic device under test, wherein the electronic device under test contains a tunable antenna having an adjustable antenna tuning element and the radio-frequency test system includes a signal generator and a test chamber, the method comprising:
placing the adjustable antenna tuning element in respective states;
with the signal generator, providing radio-frequency test signals to the tunable antenna via a radio-frequency test probe that is in direct contact with the tunable antenna;
simulating signal interference from a user body part by placing a phantom object in the vicinity of the electronic device during testing; and
while the phantom object is placed in the vicinity of the electronic device, measuring antenna performance for the tunable antenna when the adjustable antenna tuning element is placed in each of the respective states.

12. The method defined in claim 11 wherein the adjustable antenna tuning element comprises at least one adjustable circuit selected from the group consisting of: a radio-frequency switch, a tunable resistive component, a tunable capacitive component, and a tunable inductive component.

13. The method defined in claim 12, further comprising:
with a positioner in the test chamber, placing the electronic device under testing in different orientations while measuring the antenna performance.

14. The method defined in claim 12, wherein providing radio-frequency test signals to the tunable antenna comprises providing radio-frequency test signals transmitted at a given frequency to the tunable antenna, and wherein measuring the antenna performance for the tunable antenna comprises:
with a radio-frequency tester, measuring signal levels at harmonic frequencies that are equal to integer multiples of the given frequency for signals that are reflected back from the tunable antenna on the input line as a result of providing the radio-frequency test signals with the signal generator.

15. The method defined in claim 12, wherein providing radio-frequency test signals to the tunable antenna comprises providing radio-frequency test signals transmitted at a given frequency to the tunable antenna, and wherein measuring the antenna performance for the tunable antenna comprises:
with a radio-frequency tester, measuring signal levels at harmonic frequencies that are equal to integer multiples of the given frequency for signals that are radiated from the tunable antenna as a result of providing the radio-frequency test signals with the signal generator.

16. A method for using a test system to test an electronic device having a tunable antenna, wherein the test system includes a signal generator and a plurality of radio-frequency testers, the method comprising:
with the signal generator, providing radio-frequency test signals to the tunable antenna via an input line;
with a first radio-frequency tester in the plurality of radio-frequency testers, measuring signals that are reflected back from the tunable antenna on the input line as a result of providing the radio-frequency test signals with the signal generator; and
with a second radio-frequency tester in the plurality of radio-frequency testers, measuring signals that are radiated from the tunable antenna as a result of providing the radio-frequency test signals with the signal generator, wherein providing the radio-frequency test signals to the tunable antenna comprises providing the radio-frequency test signals transmitted at a given frequency to the tunable antenna, the first radio-frequency tester comprises a spectrum analyzer, and measuring the signals that are reflected back from the tunable antenna comprises measuring signal levels at harmonic frequencies that are equal to integer multiples of the given frequency for the signals that are reflected back from the tunable antenna with the spectrum analyzer.

17. The method defined in claim 16, wherein the first radio-frequency tester comprises a power meter, and wherein measuring the signals that are reflected back from the tunable antenna comprises obtaining reflection coefficient data with the power meter.

18. The method defined in claim 16, wherein the tunable antenna includes an adjustable antenna tuning element, the method further comprising:

placing the adjustable antenna tuning element in respective states; and simulating signal interference from a user body part by placing a phantom object in the vicinity of the electronic device during testing when the adjustable antenna tuning element is placed in each of the respective states.

19. A method for using a test system to test an electronic device having a tunable antenna, wherein the test system includes a signal generator and a plurality of radio-frequency testers, the method comprising:

with the signal generator, providing radio-frequency test signals to the tunable antenna via an input line;

with a first radio-frequency tester in the plurality of radio-frequency testers, measuring signals that are reflected back from the tunable antenna on the input line as a result of providing the radio-frequency test signals with the signal generator; and with a second radio-frequency tester in the plurality of radio-frequency testers, measuring signals that are radiated from the tunable antenna as a result of providing the radio-frequency test signals with the signal generator, wherein providing the radio-frequency test signals to the tunable antenna comprises providing the radio-frequency test signals transmitted at a given frequency to the tunable antenna, the second radio-frequency tester comprises a spectrum analyzer, and measuring the signals that are radiated from the tunable antenna comprises measuring signal levels at harmonic frequencies that are equal to integer multiples of the given frequency for the signals that are radiated from the tunable antenna with the spectrum analyzer.

* * * * *